United States Patent
Tomofuji

[19]

[11] Patent Number: 6,142,097
[45] Date of Patent: Nov. 7, 2000

[54] OPTICAL MEMBRANE FORMING APPARATUS AND OPTICAL DEVICE PRODUCED BY THE SAME

[75] Inventor: Tetsuya Tomofuji, Kawasaki, Japan

[73] Assignee: Nikon Corporation, Tokyo, Japan

[21] Appl. No.: 09/233,707

[22] Filed: Jan. 19, 1999

[30] Foreign Application Priority Data

Jan. 20, 1998 [JP] Japan ................................. 10-008755

[51] Int. Cl.$^7$ .................................................. C23C 16/00
[52] U.S. Cl. ........................... 118/723 VE; 118/723 EB; 118/730; 204/298.27; 204/298.11
[58] Field of Search ...................... 118/723 VE, 723 EB, 118/730; 204/298.27, 298.11

[56] References Cited

U.S. PATENT DOCUMENTS

| | | | |
|---|---|---|---|
| 3,763,821 | 10/1973 | Gorinas et al. | 118/730 |
| 3,853,091 | 12/1974 | Christensen et al. | 118/730 |
| 3,858,547 | 1/1975 | Bergfelt | 118/730 |
| 4,023,523 | 5/1977 | Ing | 118/726 |
| 4,284,033 | 8/1981 | Del Rio | 118/730 |
| 4,303,694 | 12/1981 | Bois | 427/42 |
| 4,368,689 | 1/1983 | Jones | 118/688 |
| 4,600,489 | 7/1986 | Lefkow | 204/192 R |
| 4,620,081 | 10/1986 | Zeren | 219/121 EE |
| 4,724,058 | 2/1988 | Morrison | 204/192.38 |
| 4,811,687 | 3/1989 | Prince | 118/666 |
| 4,863,581 | 9/1989 | Inokuti et al. | 204/298 |
| 4,951,604 | 8/1990 | Temple et al. | 118/723 VE |
| 5,403,400 | 4/1995 | Nighiguchi | 118/723 EB |
| 5,525,158 | 6/1996 | Tsukazaki et al. | 118/723 CB |
| 5,525,199 | 6/1996 | Scobey | 204/192.26 |

*Primary Examiner*—Jeffrie R Lund
*Attorney, Agent, or Firm*—Chapman and Cutler

[57] ABSTRACT

An optical membrane forming apparatus comprises a vacuum chamber (7), a lens holder (2) placed in the chamber (7) for holding one or more lenses (3) in such a manner that each lens (3) is rotational about its axis, and that the lens holder (2) itself is rotational about its own axis, and a plurality of vaporization sources (10$a$–10$c$) placed in the chamber (7). Each of the vaporization sources (10$a$–10$c$) produces vaporized particles for forming a layer of the membrane on the surface of the lens (3). The vaporization rate of the plurality of vaporization sources are independently controlled. A diaphragm plate (4) is placed between the vaporization sources (10$a$–10$c$) and the lenses (3) in order to control the direction of diffusion of the vaporized particles. Each of the sources (10$a$–10$c$) has a sample container which is partitioned into a plurality of rooms to store different samples.

5 Claims, 6 Drawing Sheets

RATIO OF VAPORIZATION RATE

|  | Ist SOURCE 10a | 2nd SOURCE 10b 3rd SOURCE 10c |
|---|---|---|
| $Al_2O_3$ | 1.0 | 0.75 |
| $ZrO_2$ | 1.0 | 0.85 |
| $MgF_2$ | 1.0 | 0.95 |

OPTICAL MEMBRANE FORMING APPARATUS AND OPTICAL DEVICE PRODUCED BY THE SAME

BACKGROUND OF THE INVENTION

1. Field of Invention

This invention relates to an apparatus for forming an optical membrane of a uniform thickness, such as a reflection coating and an antireflection coating, on a curved surface of an optical device (e.g., a lens, a concave or convex mirror).

2. Description of the Related Art

With a conventional optical membrane forming apparatus, the particles vaporized by the vaporization source J are spattered toward the optical device K held above the vaporization source J, and deposited on the surface of the optical device K, as shown in FIG. 6. If the vaporization source J is placed on a plane, the thickness of the membrane formed on the optical device K in the ideal state is defined by equation:

$$t \propto \cos^2\theta / d^2 \qquad (1)$$

where t is the thickness of the membrane formed on the optical device K, $\theta$ is the angle between the vertical axis extending upward from the vaporization plane and the spattering direction of the vaporized particle, and d is the distance between the vaporization source J and the optical device K which is positioned in a plane parallel to the plane on which the vaporization source J is placed.

As is defined by equation (1), the thickness of the membrane formed on a plane which is parallel to the vaporization plane with a certain distance from the vaporization plane is the greatest at a point directly above the vaporization source J, and decreases as $\theta$ increases (that is, the position on the plane is apart from the vaporization source J). For this reason, the thickness of the membrane on the optical device K is apt to be uneven. In addition, the actual distribution of vaporization is likely to deviate from the ideal state depending on the type and shape of the sample to be vaporized, the atmosphere of the vacuum chamber, and the vaporization conditions. Especially when forming a membrane on an optical device having a curved surface, such as a concave mirror and a convex mirror, the degree of unevenness in the thickness of the optical membrane becomes large.

In order to correct the unevenness, an apparatus shown in FIG. 7 was proposed. The apparatus 101 for forming a uniform optical membrane comprises a vacuum chamber 107, in which a substrate holder 2 which rotates about its axis is held above the vaporization source 110. Lens substrates 3 are mounted on the substrate holder 2. Each of the lens substrates 3 is also rotational about its axis, which they are revolved about the rotational axis of the substrate holder 2. A mask 106 is positioned between the vaporization source 110 and the lenses 3. A sample is heated in the vaporization source 110, and the vaporized particles are deposited on the lens substrates 3, whereby a membrane is formed on each of the lens substrates 3.

The substrate holder 2 holds a plurality of lens substrates 3 so that each of the lens substrates 3 rotates about its axis, as shown in FIG. 8. The round aperture 8 in the center of the substrate holder 2 is a monitor aperture, in which a quartz oscillator is fixed. The quartz oscillator detects any changes in the thickness of the membrane formed on the lens substrate 3 as changes in the frequency of the quartz oscillator itself.

The mask 106 is provided for the purpose of adjusting the amount of vaporized particles that reach the region in which the membrane tends to be thicker than in other regions. In this sense, the mask 106 functions as a correction plate. This mask 106 restricts the amount of the vaporized particles incident to the lens substrate 3 at a normal angle (that is, the particles striking the center of the lens substrate 3), while it only slightly adjust the amount of the particle incident obliquely to the lens substrate 3 (that is, the particles striking the periphery of the lens substrate 3), such that the thickness of the membrane becomes uniform on the lens 3.

In general, an optical membrane has a multi-layer structure which consists of two or more materials. When forming such a multi-layer membrane on the lens substrate 3 using a conventional optical membrane forming apparatus 101, the vaporization sample in the vaporization source 110 is changed, while maintaining the vacuum in the chamber 107.

Because several different vaporization materials are used to form a multi-layer membrane, each layer having a similar thickness, it is desirable to use a mask 106 suitable to each material (or each layer). However, since it is difficult to change the mask 106 each time the vaporization material or the sample is change, while maintaining the vacuum level constant, only a single mask 106 which is designed so as to be suitable to the vaporization material which is the most dominant (i.e., which forms the thickest layer) in the membrane is used in the conventional technique. In other words, the mask 106 takes into account the vaporization distribution of the most dominant layer in the membrane.

With a single mask 106, the thickness of each layer of the multi-layer membrane may vary depending on the position on the lens substrate 3, and as a result, the designed optical properties may not be achieved.

For example, if a three-layer anti-reflection membrane having a $MgF_2$ layer, a $ZrO_2$ layer, and an $Al_2O_3$ layer in this order from the top, with the thickness of the quarter wavelength, the half wavelength, and the quarter wavelength, respectively, is formed on a lens with the ratio of the radius of curvature R to the effective diameter D is 1.4:2, a designed thickness of the membrane is achieved at and near the vertex of the lens, but the thickness of the membrane deviate from the designed value at the periphery of the lens.

The reflectance of such an anti-reflection membrane formed by the conventional apparatus 101 is shown in FIGS. 10 and 11. FIG. 11 shows the reflectance at the vertex of the lens, and FIG. 11 shows the reflectance at the periphery of the lens. As is shown in these figures, the reflectance of the lens varies between the vertex and the periphery because the thickness of the membrane deviates from the designed value at the periphery of the lens.

SUMMARY OF THE INVENTION

Therefore, it is an object of the invention to overcome these prior art problems, and to provide an optical membrane forming apparatus which can form a uniform membrane on an optical element having a curved surface (e.g., a lens) by reducing the variation in the thickness of the membrane as much as possible. Another object of the invention is to provide an optical element on which a uniform optical membrane is formed with little variation in the thickness.

In order to achieve the objects, with an optical membrane forming apparatus according to the invention, one or more optical elements (e.g., lenses) are held by a holder within a chamber in such a manner that each of the optical elements is rotational about its axis, and that the holder itself is rotational about its own axis. A plurality of vaporization sources are placed in the chamber, each source producing vaporized particles for forming a layer of the membrane on the surface of the optical element. The vaporization rates of the plurality of vaporization sources are independently controlled in order to make the thickness of the membrane uniform over the entire surface of the optical element.

Since the vaporization rate of each vaporization source is independently controlled, the amount of the vaporized particles incident on the rotating optical elements from different sources (or the different directions) can be adjusted so that the thickness of the layer is uniform over the entire surface of the optical element. This arrangement is especially effective for coating a lens having a large radius of curvature.

The feature of this invention is using a plurality of vaporization sources in order to spattering the vaporized particles from many different directions, while independently controlling the amount of the vaporized particles produced by the vaporization sources. Unlike the conventional apparatus using a single vaporization source to form a membrane on the entire surface of a lens, the optical forming apparatus of the present invention allows a uniform membrane to be formed on each of the optical elements. In general, the vaporized particles incident to the lens surface at or near the normal angle adhere to the lens surface most efficiently. Therefore, the vaporization sources in this invention are placed so that the vaporized particles strike the lens surfaces at or near the normal angle at any position of the lens surfaces.

As the angle θ (FIG. 6) between the vertical line extending from the vaporization plane and the direction of the vaporized particle striking the lens surface is small, the thickness of the layer formed by these particle increases, as compared with other areas of the layer formed by the particles striking at a large angle. Therefore, the amount of vaporized particles produced by the vaporization source which makes a smaller angle with respect to the optical element being coated is controlled so as to be slightly smaller than the vaporization amount of other vaporization sources.

Preferably, these vaporization sources are placed at different distances from the rotation axis of the holder which is coincident with the revolution axis of the optical elements held by the holder. (The rotation axis of the holder is indicated as symbol Ca in FIG. 1.) This arrangement allows the vaporized particles to strike the optical elements at various incident angles from different directions, and to form a uniform membrane with a constant thickness.

It is also preferable to provide a diaphragm between the vaporization sources and the optical element(s) held by the holder in order to control the direction of the diffusion of the vaporized particles produced by each of the vaporization sources. Thus, the incident angle of the vaporization particle reaching the optical element (that is, the solid angle of the diffusion of the particles) is controlled, and the thickness distribution of the membrane formed on the optical element is made uniform.

Preferably, each of the vaporization sources is designed so that it can contain a plurality of vaporization materials separately, and a desired material is selected and vaporized among from the plurality of vaporization materials separately contained. With this arrangement, a multi-layered membrane can be easily formed under the constant conditions and in the same atmosphere in the chamber, without displacing the vaporization materials from the chamber.

If different materials are used to form a multi-layer membrane, the thickness of the final membrane may vary due to the difference among the vaporization samples even under the constant conditions. However, by using a plurality of vaporization sources, and adjusting the amount of vaporized particles for each source, a high-quality multi-layer membrane with a uniform thickness can be formed.

One of the vaporization sources (10a in FIG. 1) is preferably placed on the center axis Ca of the holder. It is also preferable that at least one of the vaporization sources is placed on the rotation axis (Cb or Cc in FIG. 1) of one of the optical elements held by the holder. This arrangement allows the vaporized particles produced by the source placed on the center axis of the holder to strike the periphery of the optical element at or near the normal angle, and allows the vaporized particles produced by the source placed on the rotation axis of the optical elements to strikes the center of the optical element held by the holder at and near the normal angle.

By using the optical membrane forming apparatus described above, an optical element, on which a uniform membrane is formed with little variation in thickness, can be obtained.

BRIEF DESCRIPTION OF THE DRAWINGS

The above and other objects, features, and advantages of the invention will be apparent from the following detailed description with reference to the attached drawings, wherein.

DETAILED DESCRIPTION OF THE PREFERRED EMBODIMENTS

Figure 1:
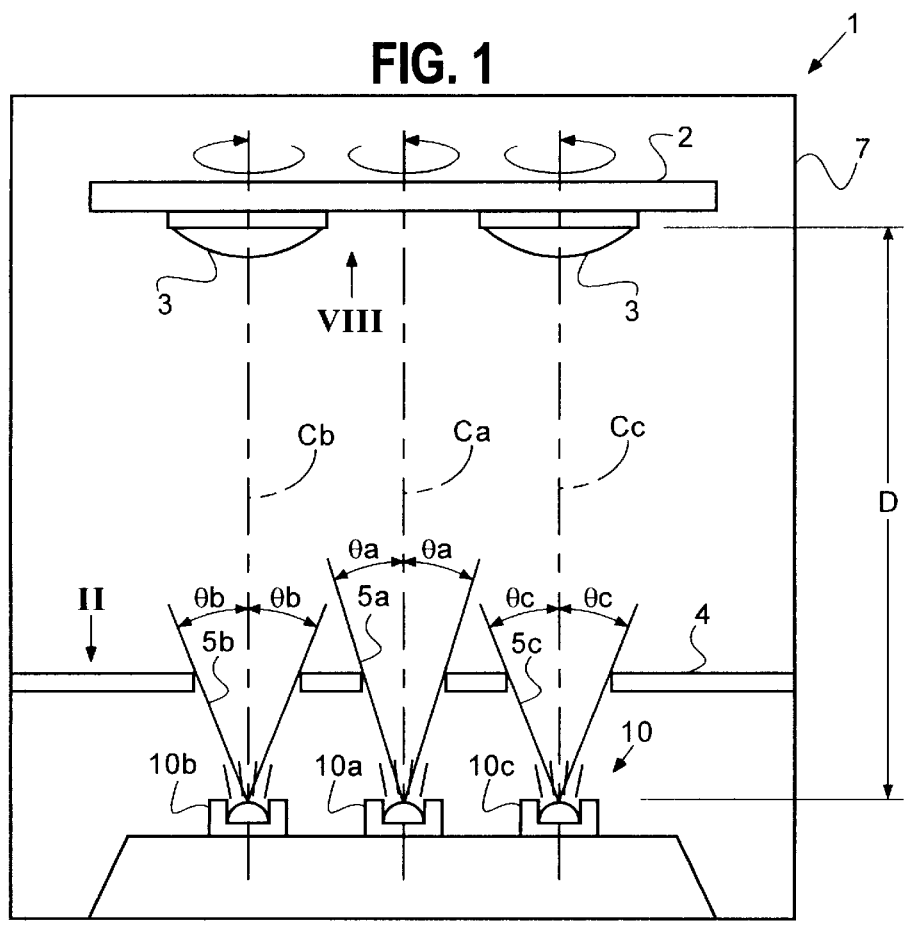
FIG. 1 is a schematic diagram of the optical membrane forming apparatus according to the first embodiment of the invention.
Figure 8:
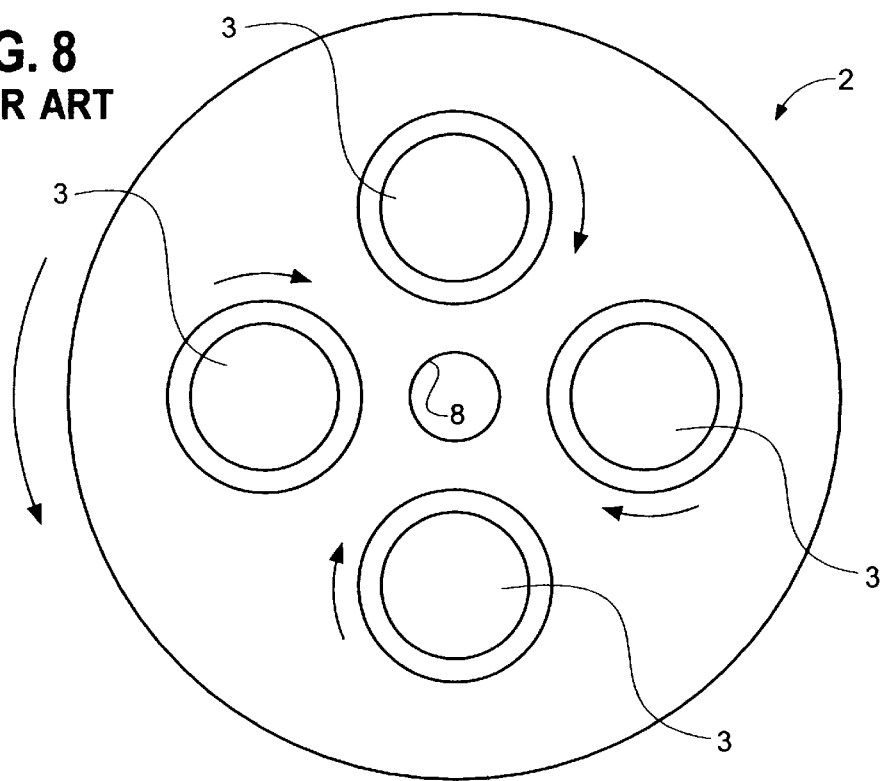
FIG. 8 is a plan view of the conventional lens holder used in optical membrane forming apparatuses, the lens holder being indicated by the arrow VIII in FIG. 1.

FIG. 1 illustrates an optical membrane forming apparatus 1 according to an embodiment of the invention. The optical membrane forming apparatus 1 has a vacuum chamber 7 which is sealed so as to be airtight. A substrate holder 2 is placed in the vacuum chamber 7 so as to be rotational about its axis. In this example, four lens substrates 3 are held by the holder 2 so as to be rotational about their own axes. These lens substrates 3 revolve about the rotation axis of the substrate holder 2, while they are rotating about their own axes. The substrate holder 2 used in this embodiment is the same as that shown in FIG. 8, and therefore, the explanation for it will be omitted here.

Vaporization sources 10 are placed on the bottom of the vacuum chamber 7. In this example, the first source 10a, the second source 10b, and the third source 10c are used. The first source 10a is positioned directly below the center of the substrate holder 2, which is on the rotation axis Ca of the substrate holder 2 (i.e., the revolution axis of the lenses 3). The second and third sources 10b and 10c are positioned on the rotation axes Cb and Cc of the lenses 3. The second and third sources 10b and 10c are on the symmetric positions with respect to the first source 10a.

Figure 2:
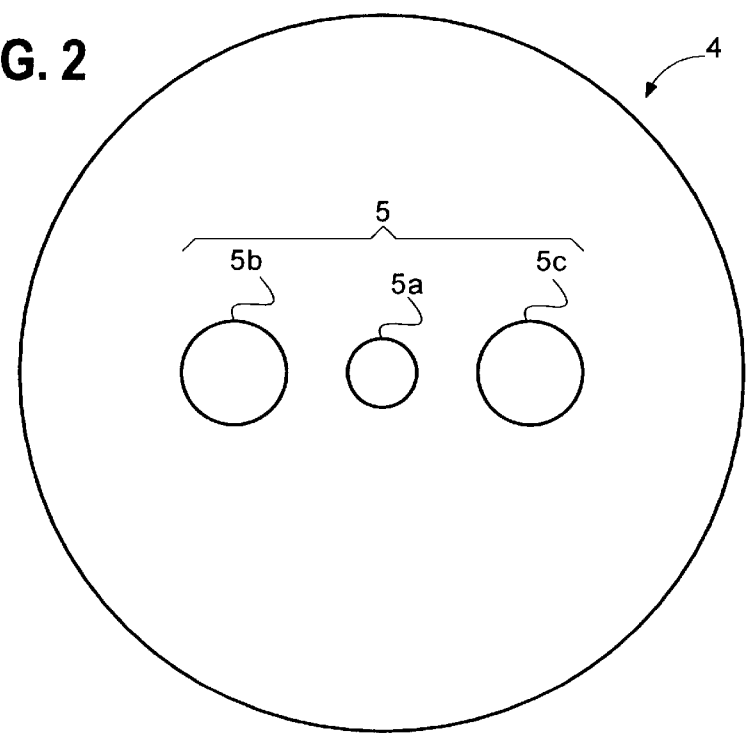
FIG. 2 is a plan view of the diagram plate used in the optical membrane forming apparatus shown in FIG. 1.

A diaphragm plate 4 having an aperture 5 is positioned between the vaporization sources 10 and the substrate holder 2 in order to control the stream of the vaporized particles from the vaporization sources 10. FIG. 2 shows three round apertures 5a, 5b, and 5c, which correspond to the vaporization sources 10a, 10b, and 10c, respectively, are formed in the diaphragm plate 4. The center (or the first) aperture 5a, which corresponds to the first source 10a, is smaller than the other two apertures 5b and 5c, which correspond to the second and third sources 10b and 10c.

The stream of vaporized particles produced by the first vaporization source 10a spreads by angle θa from the center axis Ca as they flow upward. The upward streams from the second and third sources 10b and 10c also spread from the center axes Cb and Cc, respectively, by angles θb and θc which are greater than the spread angle θa.

With this arrangement, the amount of vaporized particles reaching the peripheral region of each lens 3, which is rotating about its own axis and, at the same time, revolving about the center axis Ca of the holder, is slightly greater than the amount of particles reaching the center of each lens 3, whereby the thickness distribution of the membrane formed on each lens 3 is made uniform. The shape and size of each of the apertures 5a, 5b, and 5c are appropriately selected according to the shape of the lens 3 so that a uniform membrane is formed on the curved surface of the lens 3.

Figures 3, 4:
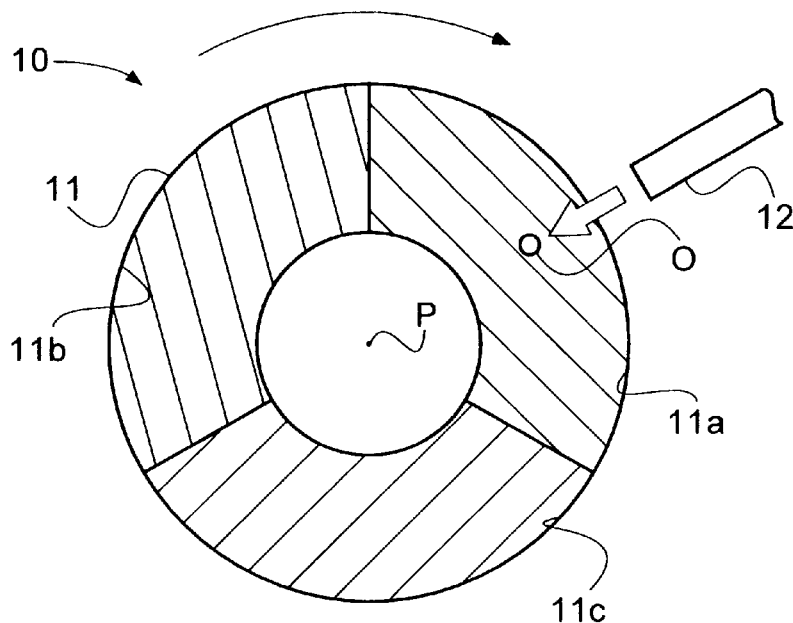
FIG. 3 is a plan view of the vaporization source used in the optical membrane forming apparatus shown in FIG. 1.
FIG. 4 is a table showing the ratio of the vaporization rates of different materials (i.e., samples) and different vaporization sources.

FIG. 3 is a plan view of the vaporization source 10. The vaporization source 10 comprises a sample container 11, and an electron gun 12 for heating and vaporizing the sample stored in the container 11. The vaporization sources 10a–10c used in this embodiment have the same structure, as shown in FIG. 3.

The sample container 11 is partitioned into several rooms to contain different materials. In the example shown in FIG. 3, the container 11 is partitioned into three rooms 11a, 11b, and 11c. The sample container 11 is rotated clockwise about the center P, as indicated by the arrow in FIG. 3, when different samples stored in different rooms are used. The electron gun 12 is positioned so as to aim and heat the point O which is offset from the center P of the sample container 11. Accordingly, when the sample stored in the room (e.g., 11a) is being vaporized, other samples stored in other rooms (11b and 11c) are not heated or vaporized.

Prior to starting the optical membrane forming apparatus 1, prescribed different sample materials are placed in the rooms 11a–11c of the sample container 11, and the vacuum chamber is sealed and evacuated. Then, for example, the first sample stored in the first room 11a is heated and vaporized by the electron gun 12. The vaporized particles adhere to the lenses 3 and form a first layer of the optical membrane.

Then, the sample holder 11 is rotated about the center P by 120° in the direction shown by the arrow in FIG. 3, and the second sample stored in the second room 11b is heated and vaporized by the electron gun 12. The vaporized particles of the second sample form a second layer of the membrane over the first layer, which was previously formed on the surface of the lens 3. Similarly, the sample container 11 is again rotated to vaporize the third sample and form a third layer of the membrane.

With this vaporization source 10, sample materials can be easily changed, while the vacuum is kept constant in the vacuum chamber 7. When forming a multi-layered membrane on the lens 3, necessary samples are simply placed in the sample container 11, and successively vaporized to form different layers. This technique is simple and reliable.

In addition, by varying the power voltages of the electron guns 12 among the vaporization sources 10a–10c, the amount of vaporization of each source can be adjusted so as to obtain the optimum membrane. Even though the angle θ between the vertical line from the source and the line toward the lens 3 differs among the sources 10a–10c, the overall vaporization can be controlled by adjusting the power voltage of each source so that the amount of vaporization of the source which makes a smaller θ is slightly reduced, as compared with the sources which make larger angles θ.

Furthermore, since different materials affect the formation of the membrane in different ways, the thickness of the membrane may vary depending on the samples. The source control according to the invention can also solve this problem. In this case, the amount of vaporization from the sample which has a large influence to the membrane is slightly reduced. This technique allows a high-quality membrane to be formed with a uniform distribution of thickness, without changing the correction plate (e.g., a mask 106) each time the sample material is changed. The combination of the diaphragm plate 4 and the voltage control of the electron gun 12 can achieve the uniform thickness of the membrane on the lens 3 more effectively.

Thus, the amount of vaporization of each source 10 can be easily and externally controlled by simply adjusting the power voltage of the electron gun 12, while the vacuum in the chamber 7 is maintained constant. As the heating means for the vaporization source, a resistance heating means (e.g., electric heaters) or a induction heating means may be used in place of the electron gun 12. In this case, the input voltage is regulated to adjust the temperature of the heater, whereby the amount of vaporization can be controlled.

Figure 9:
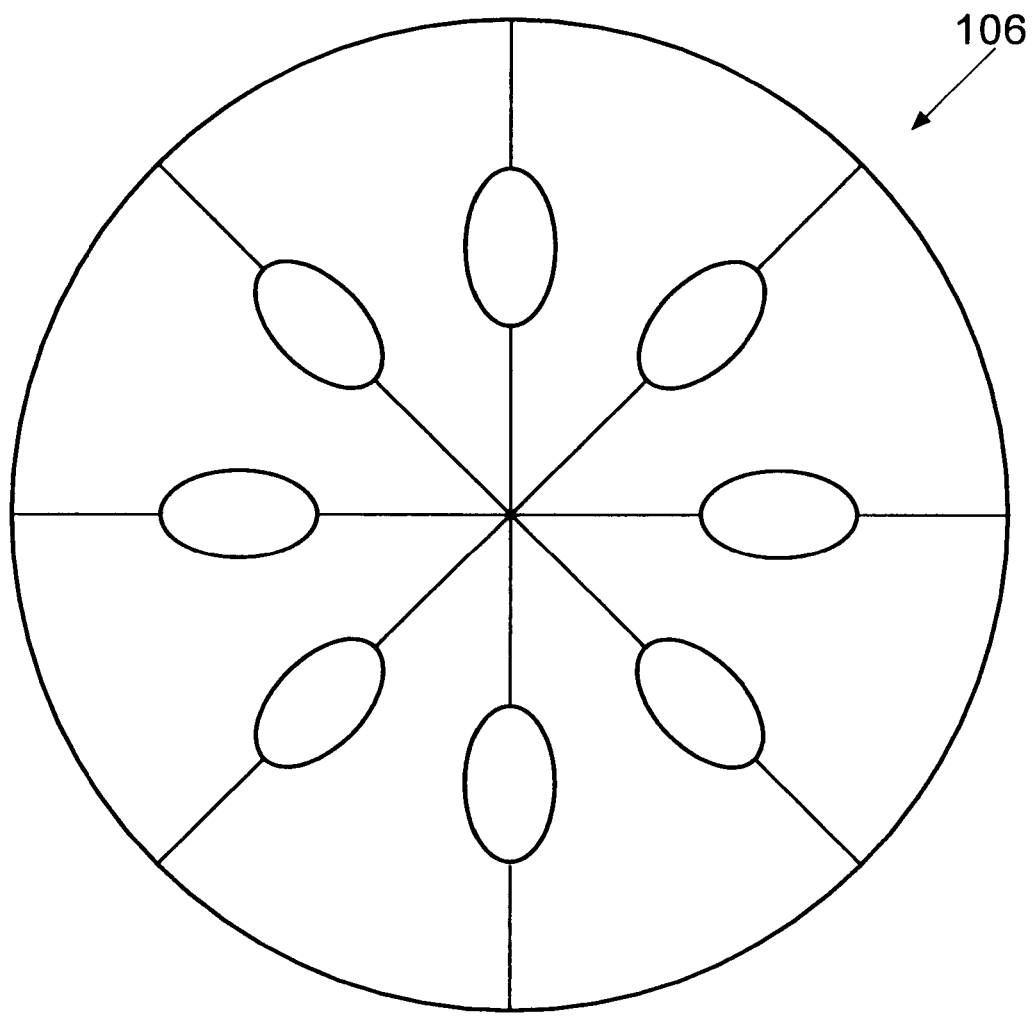
FIG. 9 is a plan view of the mask used in a conventional optical membrane forming apparatus.

In the embodiment described above, the diaphragm plate 4 is not necessarily provided in the vacuum chamber 7. The control of the electron guns 12 (i.e., the control of the vaporization sources) can solely achieve a membrane with a uniform thickness. However, for the more efficient effect, the mask 106 illustrated in FIG. 9 may be used together with the diaphragm plate 4.

Although, in this embodiment, each of the vaporization sources 10a–10c has three rooms for containing different materials in order to form a multi-layer membrane on the lens 3, the source 10 may have a single room or any number of rooms, as long as it can store at least one sample.

Although, in the embodiment, the first vaporization source 10a is positioned on the center axis Ca of the substrate holder 2 (that is, the revolution axis of the orbit of the lenses 3), it may be positioned offset from the center axis Ca. Similarly, the second and third vaporization sources 10b and 10c are not necessarily positioned on the rotation axes of the lenses 3. However, it is preferable that at least one of the vaporization sources 10 is positioned on the rotation axis of one of the lenses 3.

ACTUAL EXAMPLE

FIG. 4 is a table of the ratio of the vaporization rates for forming a multi-layer membrane.

The optical membrane forming apparatus 1 described above is used to form this multi-layer membrane. The ratio of the radius of curvature to the effective diameter of the lens to be coated is 1.4:2. A three-layer anti-reflection membrane (having $MgF_2$, $ZrO_2$, and $Al_2O_3$ layers in this order from the top) is formed on this lens. The thickness of the three layers are ¼ optical wavelength, ½ optical wavelength, and ¼ optical wavelength, respectively.

To form this anti-reflection membrane, the distance D from the vaporization plane of the source 10 to the surface of the substrate holder 2, on which lenses 3 are held, is set to 1000 mm. After the sizes of the apertures 5a, 5b and 5c are adjusted, the diaphragm plate 4 is placed between the vaporization sources 10 and the lenses 3 so that the angle θa for the vaporization stream from the first source 10a is 16°, and the angles θb and θc for the vaporization streams from the second and third sources 10b and 10c are both 25°. The aperture 5a is formed about the center axis Ca of the substrate holder 2, and the apertures 5b and 5c are formed about the rotation axes Cb and Cc of the lenses 3 with diameters greater than that of the aperture 5a.

Figure 6:
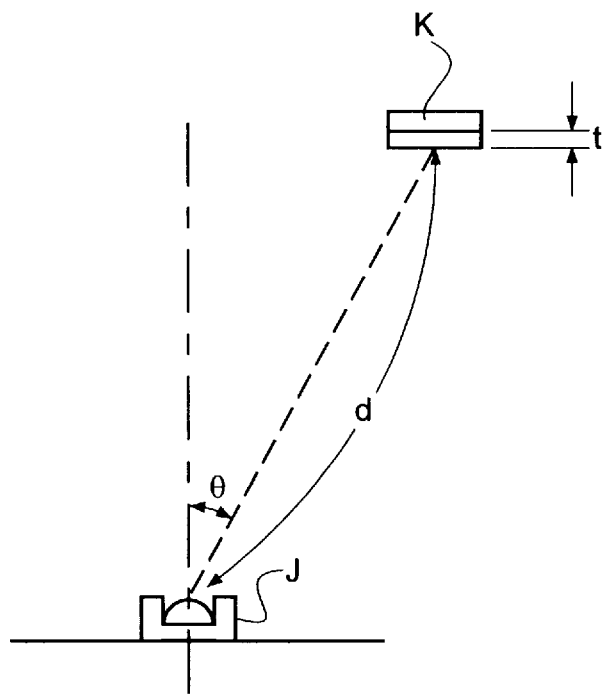
FIG. 6 shows the diffusing angle of the vaporized particle, and the distance between the vaporization source and the lens.

$Al_2O_3$ is placed in the first room 11a, $ZrO_2$ is placed in the second room 11b, and $MgF_2$ is placed in the third room 11c of the sample container 11. These samples are vaporized from each of the vaporization sources 10a–10c at the vaporization rates shown in FIG. 4. FIG. 4 only shows the ratio of the vaporization rates of the sources 10 and the three samples. This ratio is determined from the thickness "t" (FIG. 6) of the layer formed on a plane parallel to the vaporization plane at a certain height in a predetermined time.

When forming the optical membrane, $Al_2O_3$ in the first room 11a of each source 10 is heated to form an $Al_2O_3$ thin film on the lenses 3. At this time, the power voltages of the electron guns 12 of the sources 10a–10c are regulated so that the vaporization rates of the second and third sources 10b and 10c become 75% of the vaporization rate of the first source 10a. In other words, the voltages are regulated so that the thickness of the $Al_2O_3$ films formed by the second and third sources 10b and 10c would be 75% of the thickness of the film formed by the particles from the first source 10a, on the assumption that the lens 3 is positioned at the same distance from the first through third sources 10a–10c (i.e., so that the angles θ determined by the sources 10a–10c are equal).

In the optical membrane forming apparatus 1 shown in FIG. 1, the second and third sources 10b and 10c are positioned directly below the lenses 3, and therefore, the angles θb and θc are both 0°, which is smaller than the angle θa made by the first source 10a and the lens 3. Accordingly, the amounts of vaporization from the second and third sources 10b and 10c are slightly reduced, as compared with the vaporization from the first source 10a, so that the thickness of the $Al_2O_3$ film becomes uniform over the entire surface of the lens 3.

When the thickness of the $Al_2O_3$ film reaches ¼ optical wavelength, the vaporization of the first sample ($Al_2O_3$) terminates. Then, the sample container 11 is rotated by 120° clockwise (in the direction of the arrow in FIG. 3), and $ZrO_2$ stored in the second room 11b is heated and vaporized. For the vaporization of $ZrO_2$, the power voltages of the electron guns 12 are regulated so that the vaporization rates of the second and third sources 10b and 10c become 85% of the vaporization rate of the first source 10a.

When the thickness of the $ZrO_2$ film reaches ½ optical wavelength, the vaporization of the $ZrO_2$ terminates. Then, the sample container 11 is again rotated by 120° clockwise, and $MgF_2$ stored in the third room 11c is heated and vaporized. For the vaporization of $MgF_2$, the power voltages of the electron guns 12 are regulated so that the vaporization rates of the second and third sources 10b and 10c become 95% of the vaporization rate of the first source 10a. When the thickness of the $MgF_2$ film reaches ¼ optical wavelength, the vaporization of the $MgF_2$ terminates. In this manner, a lens coated by a three-layer anti-reflection membrane consisting of a $MgF_2$ layer having a thickness of ¼ optical wavelength, a $ZrO_2$ layer having a thickness of ½ optical wavelength, and an $Al_2O_3$ layer having a thickness of ¼ optical wavelength.

Figure 5:
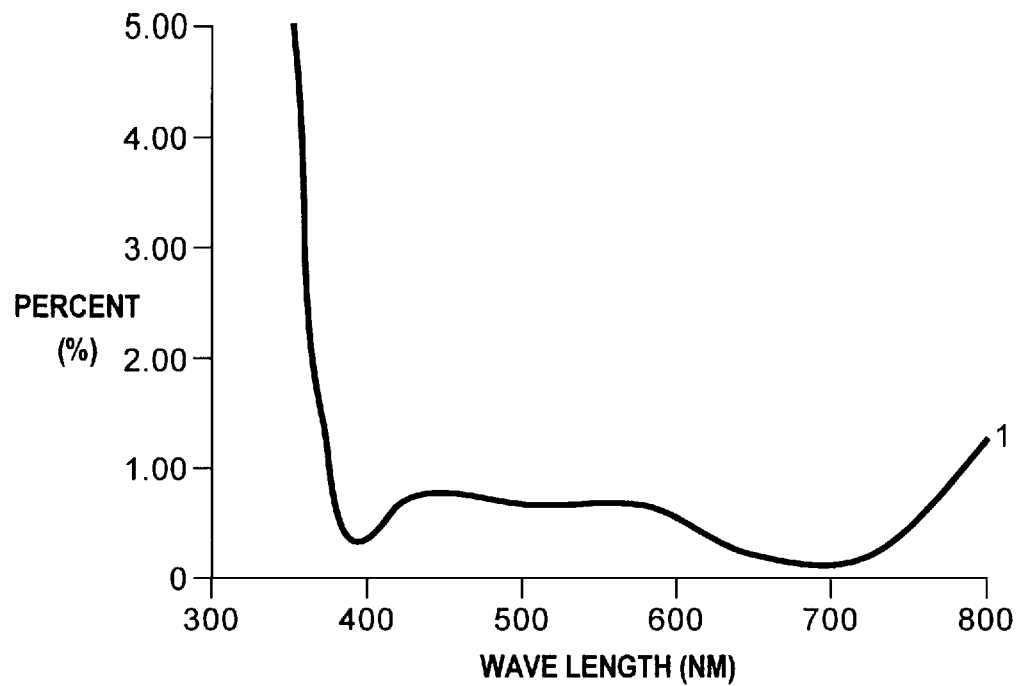
FIG. 5 is a graph showing the reflectance at the periphery of the anti-reflection membrane formed on a lens by the optical membrane forming apparatus shown in FIG. 1.
Figure 7:
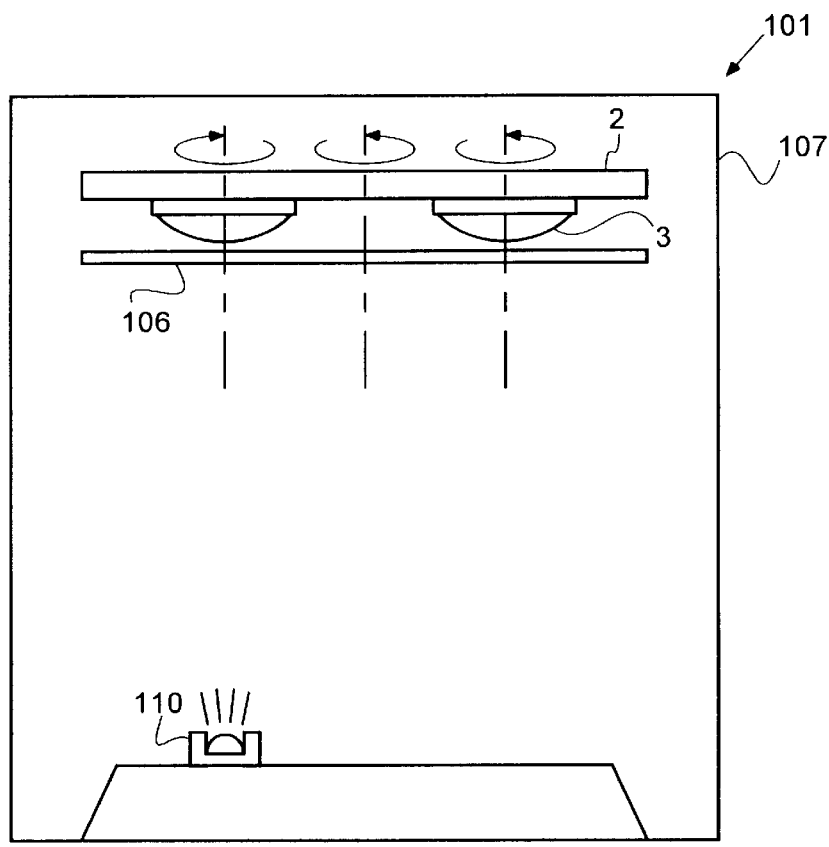
FIG. 7 illustrates a conventional optical membrane forming apparatus.
Figure 10:
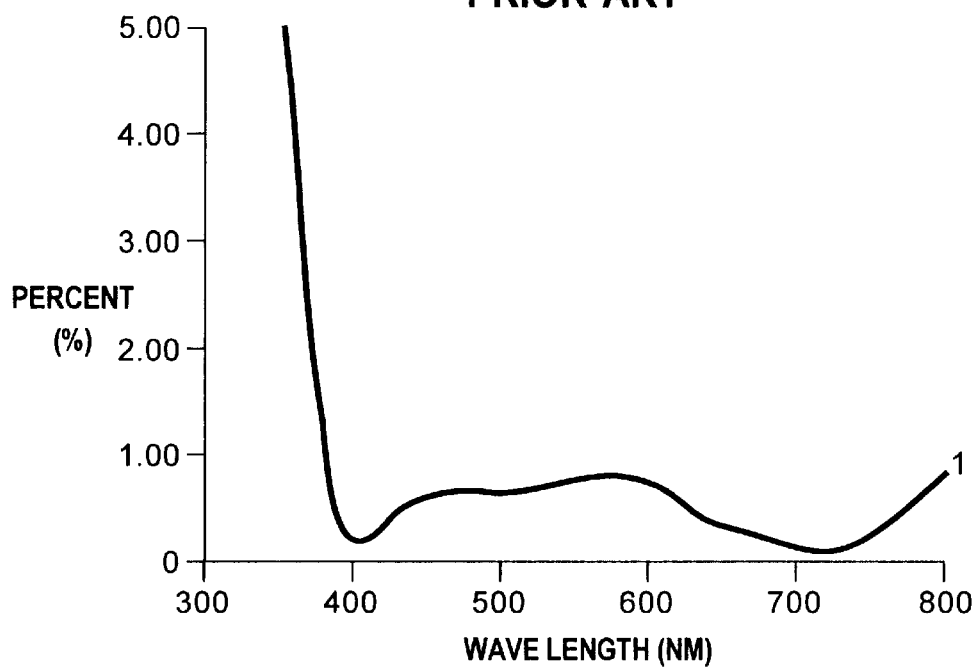
FIG. 10 is a graph showing the reflectance of the anti-reflection membrane at the vertex of the lens, the anti-reflection membrane being formed by a conventional optical membrane forming apparatus.
Figure 11:
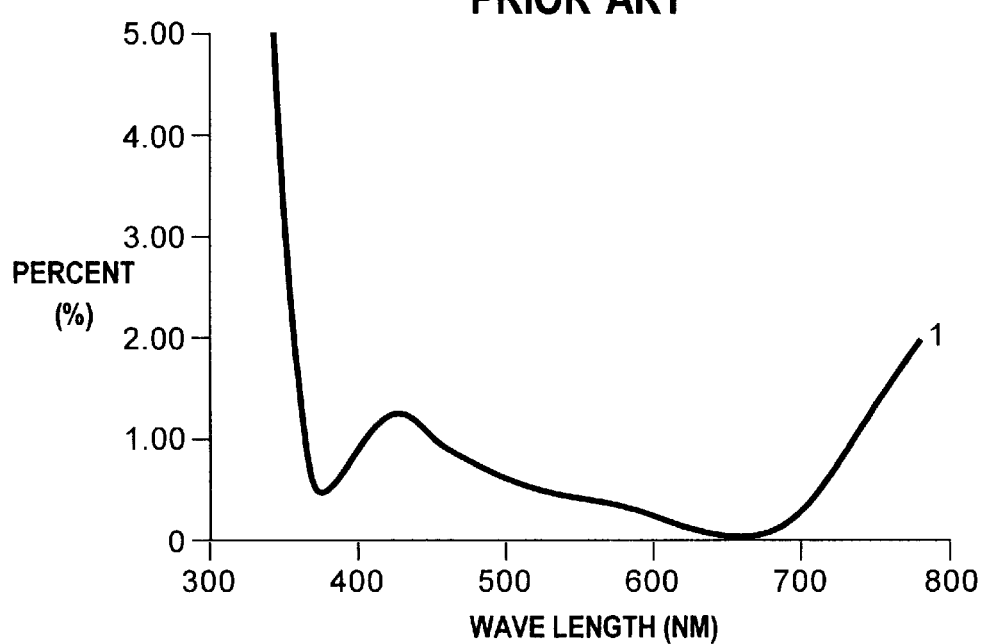
FIG. 11 is a graph showing the reflectance of the anti-reflection membrane at the periphery of the lens, the anti-reflection membrane being formed by a conventional optical membrane forming.

The reflectance of the anti-reflection membrane at the vertex of the lens 3 is shown in FIG. 10, which is the same as the reflectance of the anti-refection membrane formed by a conventional apparatus 101 shown in FIG. 7. On the other hand, the reflectance of the anti-reflection membrane at the periphery of the lens 3 according to the invention is shown in FIG. 5. If this reflectance graph is compared with the graph shown in FIG. 11, which plots the reflectance at the periphery of the lens obtained from a conventional apparatus, it is clear that the reflectance at the periphery is very similar to that at the vertex of the lens in the optical membrane formed according to the present invention. Thus, the optical membrane of the present invention has a high degree of uniformity over the entire surface of the lens.

As has been described, a plurality of vaporization sources are placed in the vacuum chamber, so that the vaporized particles strike the optical elements (i.e., the lenses), which are rotating about their axes, and at the same time, revolving around the center axis of the lens holder, from several sources. Even if the curvature of the optical element (or lens) is large, a uniform membrane with a constant thickness can be formed on the entire surface of the lens because the particles can hit the lens surface at or near the normal angle at any positions on the lens surface.

Furthermore, since the vaporization rate of the source which is located closer to the lens (with a smaller angle defined by that lens) is set to a slightly lower value than the vaporization rates of other sources located farther from the same lens, differences in the optical properties (e.g., the reflectance) between the vertex and the periphery of the lens can be greatly reduced.

If the vaporization sources are placed at different distances from the rotation axis of the lens holder (i.e., the revolution axis of the lenses held by the lens holder), the vaporized particle can strike the surface of the lens at various incident angles from different directions, which can achieve a uniform membrane with a constant thickness.

If the diaphragm plate is placed between the vaporization sources and the lenses, the direction of the diffusion of the vaporized particles from each source can be controlled. This diaphragm plate defines the incident angle of the vaporization particle reaching the lens, and control the thickness distribution of the membrane formed on the lens. For example, the diaphragm plate can limit oblique incident angles, and allows the particles to strike at or near the normal incident angle.

This diaphragm plate does not have to be replaced each time the sample material is changed when a multi-layered membrane is formed, because the vaporization rates of the sources are independently controlled externally.

The sample container of each vaporization source is partitioned into multiple rooms so as to contain different sample materials separately. This arrangement can greatly facilitate the formation of a multi-layer membrane under the same vacuum condition because the sample materials do not have to be displaced from the chamber.

If the different materials affect the thickness of the membrane in different ways, the vaporization rate of each sample can be adjusted among the sources so as to make the membrane uniform with a constant thickness, even without using a correction plate.

By placing one of the vaporization sources on the rotation axis of the lens holder, and/or placing at least one of the vaporization sources on the rotation axis of one of the lenses, the vaporized particles produced by the source placed on the center axis of the lens holder can strike the periphery of the lens at or near the normal angle, while the vaporized particles produced by the source placed on the rotation axis of the lens can strike the center of the lens.

With this optical membrane forming apparatus described above, a lens coated with a uniform membrane with little variation in thickness can be obtained.

What is claimed is:

1. A device for forming a membrane, comprising:
    a chamber, which can be air-tight sealed;
    a supporting member for supporting an optical element inside said chamber and revolving and rotating the optical element;
    a plurality of vaporization sources placed in said chamber for independently producing vaporized particles in order to form the membrane on a surface of the optical element;
    a control means for controlling an amount of vaporization of each source of vaporized particles; and
    a diaphragm positioned between said optical element and said vaporization source and having at least one aperture for controlling an incident angle of the vaporized particles striking the surface of said optical element,
    wherein a thickness of the membrane to be formed is controlled by a size of said at least one aperture of said diaphragm.

2. A device for forming a membrane according to claim 1, wherein the vaporization sources are positioned on a different distance from a revolving axis of said supporting member.

3. A device for forming a membrane according to claim 1, wherein each of said plurality of vaporization sources contains a plurality of vaporization materials separated from each other.

4. A device for forming a membrane according to claim 1, wherein at least one of said plurality of vaporization sources is positioned on a revolving axis of said supporting member.

5. A device for forming a membrane according to claim 1, wherein at least one of said plurality of vaporization sources is positioned on a rotary axis of the optical device supported by said supporting member.

* * * * *